United States Patent [19]

Martin et al.

[11] Patent Number: 5,570,044
[45] Date of Patent: Oct. 29, 1996

[54] BICMOS OUTPUT DRIVER WITH REDUCED STATIC POWER CONSUMPTION

[75] Inventors: Brian C. Martin, Los Alamos; Jeffrey A. West, Albuquerque, both of N.M.

[73] Assignee: North American Philips Corporation, New York, N.Y.

[21] Appl. No.: 308,470

[22] Filed: Sep. 19, 1994

Related U.S. Application Data

[63] Continuation of Ser. No. 49,741, Apr. 19, 1993, abandoned.

[51] Int. Cl.[6] .................... H03K 19/082; H03K 19/0948
[52] U.S. Cl. .................... 326/84; 326/86; 326/18
[58] Field of Search .................... 307/443, 446, 307/475, 570; 326/18, 84, 86; 327/433

[56] References Cited

U.S. PATENT DOCUMENTS

| | | | |
|---|---|---|---|
| 4,713,561 | 12/1987 | Yamada | 307/456 |
| 4,716,310 | 12/1987 | Tanizawa et al. | 307/446 |
| 4,779,014 | 10/1988 | Masuoka et al. | 307/446 |
| 4,808,850 | 2/1989 | Masuda et al. | 307/446 |
| 4,859,878 | 8/1989 | Murayama | 307/446 |
| 4,882,534 | 11/1989 | Koshizuka | 307/570 |
| 5,001,365 | 3/1991 | Murabayashi et al. | 307/446 |
| 5,057,713 | 10/1991 | Iwamura et al. | 307/446 |
| 5,105,103 | 4/1992 | Neu | 307/570 |
| 5,118,972 | 6/1992 | Wissel et al. | 326/84 |
| 5,173,623 | 12/1992 | Chau et al. | 307/446 |
| 5,243,571 | 9/1993 | Brossard | 307/446 |

FOREIGN PATENT DOCUMENTS

| | | |
|---|---|---|
| 1177716 | 7/1989 | Japan . |
| 2239750 | 7/1991 | United Kingdom . |

OTHER PUBLICATIONS

IBM Techn. Discl. Bull. vol. 35, No. 1B, pp. 196–197; Jun. 1992.

*Primary Examiner*—Edward P. Westin
*Assistant Examiner*—Benjamin D. Driscoll
*Attorney, Agent, or Firm*—Steven R. Biren

[57] ABSTRACT

A BiCMOS power driver circuit for interfacing to a bus comprises circuitry for channelling current from a power source to the base of a bipolar device to pull the output all the way down to within a bipolar $V_{SAT}$ voltage drop of ground, and then uses feedback to turn-off the pull-down circuit to conserve power. A similar circuit functions to provide Incident Wave Switching and Glitch Suppression by monitoring the voltage level at the output and sinking current as necessary to maintain a low logic level.

3 Claims, 6 Drawing Sheets

5,570,044

BICMOS OUTPUT DRIVER WITH REDUCED STATIC POWER CONSUMPTION

This is a continuation of application Ser. No. 08/049,741, filed Apr. 19, 1993, abandoned.

This invention relates to combined field effect and bipolar transistor circuits, and in particular to such circuits used as logic circuits for interfacing to another circuit, typically a bus.

BACKGROUND OF INVENTION

Logic circuits for interfacing to a bus within a larger system, such as a CPU or a PC, are well known. As system performance has increased, the trend has been toward using combined complementary MOS (CMOS) and bipolar transistors, commonly known as BiCMOS. The major advantages are high speed and reduced power dissipation. In the typical BiCMOS circuit, CMOS devices form the input and the bipolar devices form the output. A commercially available family of such devices from Philips Components-Signetics is known as the ABT Advanced BiCMOS Interface Logic. All of the devices in this family will operate generally with a 5 volt DC supply voltage source. Usually, the circuit output is connected to, directly or indirectly, for driving, a bus common to a number of other circuits, and the input is derived from a part of the CPU or a peripheral device. The significant point is that, during operation, the bus voltage swings between the voltage source, typically 5 volts, and a reference voltage, such as ground, and these transitions are interpreted as signals by interface circuits connected to the bus.

A traditional zero-static power BiCMOS driver creates a high-to-low transition by channeling current from the driver output into the base of a pull-down bipolar transistor. This configuration is automatically zero-static power because the pull-down transistor starts turning off as the output is pulled towards a bipolar base-emitter drop VBB above ground, but the bipolar device cannot pull the output all the way to ground. Typically, an NMOS device is added to pull the output the rest of the way down. Unless a very large NMOS device consuming valuable semiconductor real estate is used, however, the last volt or so of the high-to-low transition takes a relatively long time, which depends on the load. This is undesirable for many applications.

Two attributes of desirable bus drivers are Incident Wave Switching and Glitch Suppression. Incident Wave Switching is a property of transmission lines. When the logic level on one side of a transmission line is switched, an electrical wave equal to some fraction of the total charge is launched onto the line. After some time, the line settles into the new state. Incident Wave Switching means that a valid logic level is attained with the first, or incident, electrical wave launched onto the line, thereby saving time for the bus user.

Glitch Suppression is the ability of the bus driver to maintain the integrity of a logic level on the bus. This is desirable because noise on the bus may disrupt the operation of the driver.

Known driver circuits allow Incident Wave Switching by sinking large bus currents quickly to ground.

A problem, however, is that, with the known circuit, under certain load conditions, the circuit reacts too quickly to sink large currents from the output, with the undesired result that ringing, or noise, is created, which can interfere with the proper operation of the driver circuit. Furthermore, these circuits generally do not have high current-sinking capability at low output voltages.

SUMMARY OF INVENTION

An object of the invention is an improved output driver circuit.

Another object of the invention is a BiCMOS output driver capable of quickly pulling the output substantially all the way down to a logic-low level.

A further object of the invention is a low noise BiCMOS bus interface circuit.

Still another object of the invention is a low noise BiCMOS driver with high current-sinking capability to serve as a Glitch Suppressor and to provide Incident Wave Switching of the driver circuit.

In accordance with a first aspect of the invention, a zero-static power pull-down driver circuit comprises means for channeling current from a DC power source to the base electrode of a bipolar transistor, which can therefore pull the output all the way down to a bipolar $V_{SAT}$ above the reference voltage, typically ground.

In a preferred embodiment, feedback means are provided from the output to turn-off the pull-down circuit after a full high-to-low transmission at the output in order to achieve zero-static power.

A further preferred embodiment employs a Darlington structure in the pull-down circuit for rapid turn-on and to ensure that the output is pulled all the way down to a $V_{SAT}$.

In accordance with a second aspect of the invention, in a BiCMOS bus driver adapted to provide Incident Wave Switching and Glitch Suppression, means are provided to substantially prevent ringing and noise under most output load conditions.

In a preferred embodiment, bipolar means are provided for pulling down the output to a value below a logic-low value, with further means being provided to turn-off the bipolar means unless the output rises back above a certain value.

In another preferred embodiment, ringing is substantially prevented by monitoring a voltage node or the driver output and sinking current as necessary to maintain a low logic level at the output by draining current quickly, but not so quickly as to cause significant ringing.

Certain aspects of the invention employ feedback from the output to control the pull-down circuit. They differ mainly in the following respect. In accordance with the first aspect, one circuit operates to pull-down the output hard, and then turns off to minimize power. In accordance with the second aspect, a circuit does not turn-on until a full high-to-low transition has taken place, and then it turns-on and holds the voltage low. These aspects can be used separately or together, in which case the second circuit acts to hold the output low after the first circuit has pulled it down.

The various features of novelty which characterize the invention are pointed out with particularity in the claims annexed to and forming a part of this disclosure. For a better understanding of the invention, its operating advantages and specific objects attained by its use, reference should be had

DETAILED DESCRIPTION OF PREFERRED EMBODIMENTS

In the circuits described below, similar references designate similar elements.

Figure 1:
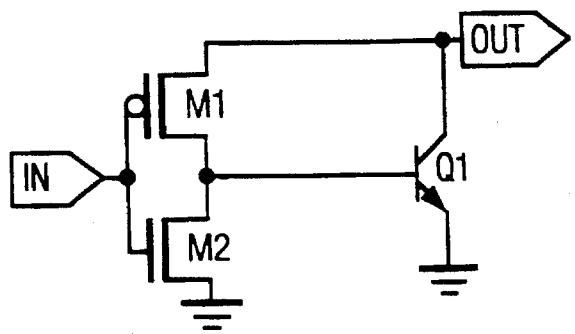
FIG. 1 shows a schematic of a simplified view of a conventional BiCMOS pull-down driver.

The conventional BiCMOS pull-down circuit shown in FIG. 1 comprises PMOS transistor M1 (the circle at the gate denotes PMOS), and NMOS transistor M2 (no circle at the gate), whose gates are connected in parallel to input IN. Their common drain-source node is connected to the base of N-type bipolar transistor Q1, whose collector is connected to the output OUT, which is connected, directly or indirectly, to a bus (not shown here) to which other interface circuits are similarly connected, or to another stage. The operating DC power supply is also not shown.

The BiCMOS pull-down circuit shown in FIG. 1, in response to an input signal, channels current from the output to the base of Q1 in order to create a high-to-low transition. As a consequence, Q1 shuts off before the output is pulled lower than a bipolar base-emitter drop $V_{BE}$ above ground. Typically, a small NMOS device (not shown here) is used in parallel with the traditional BiCMOS pull-down to "trickle" the output the rest of the way to ground. Generally, this structure guarantees a steep transition down to about a volt or so, after which the transition may slow dramatically, depending on the output load. This can result in slow propagation delays and potentially cause leakages in the next stage, by not switching subsequent circuit stages crisply.

Figure 2:
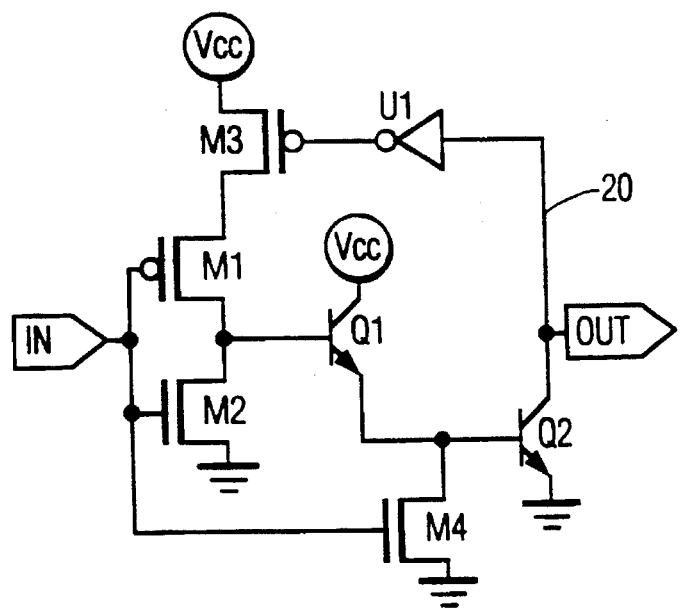
FIG. 2 shows a schematic of one form of zero-static-power pull-down driver in accordance with the invention.

FIG. 2 shows one form of fully-powered, zero-static power pull-down driver in accordance with the invention, which improves upon the traditional circuit by providing steady pull-down current throughout the high-to-low transition. This is done by channeling current from Vcc to the base of the bipolar Q2, which can therefore pull the output all the way down to a bipolar $V_{SAT}$ drop above ground, and uses feedback designated 20 from the output to turn off the pull-down circuit after a full high-to-low transition to maintain zero-static power. This is achieved by adding PMOS transistor M3 in series with M1 and M2, and connecting the gate of M3 via an inverter U1 to the output. In operation, prior to a high-to-low transition, both the input and output of the circuit are high. In this state, transistors Q1 and Q2 are off, MOSFET M1 is off and MOSFETS M2, M3 and M4 (which acts to pull charge from the base of Q2) are on. When the input goes active low, M2 and M4 turn off and M1 turns on, turning on the Darlington formed by Q1 and Q2. When Q2 pulls the output below the threshold of inverter U1, U1 switches, turning off M3, rendering the circuit zero-static power. Due to the propagation delay through U1 and the charge stored in the bases of Q1 and Q2, the output is pulled all the way to within a $V_{SAT}$ of ground.

The Darlington structure is significant for two reasons: first, since Q1 can be a very small device and still drive a large Q2, it has a low base capacitance and can be turned on rapidly by even a small M1; second, Q1 will "overcharge" the base of Q2—the charge remaining in the base of Q2 will insure that the output is pulled all the way down to a $V_{SAT}$ even after M3 turns off.

The circuit in FIG. 2 risks driving Q2 deep into saturation, however. This could slow the recovery, or shut-off time of the circuit, and thus decrease the maximum operating frequency.

Figure 3:
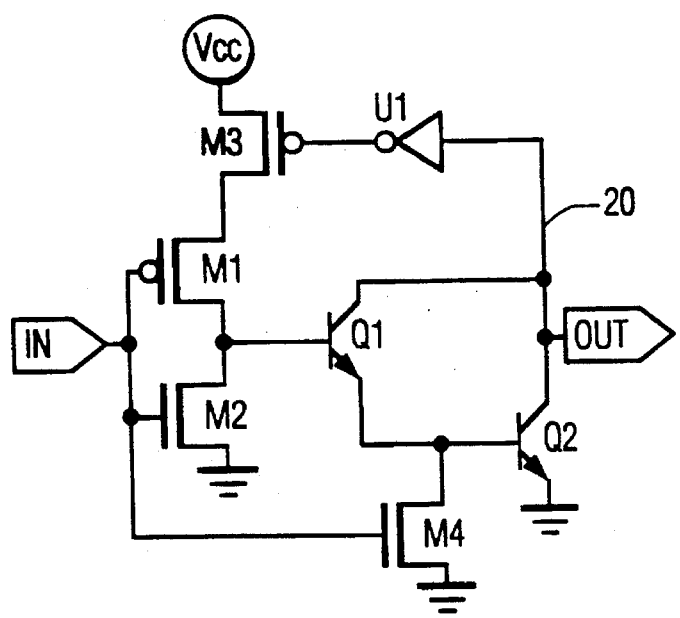
FIGS. 3, 4, and 5 each show a schematic of variant circuits in accordance with the invention of the basic circuit shown in FIG. 2.

There are two convenient methods in accordance with another feature of the invention of protecting the transistors from deep saturation. The first method is shown in FIG. 3, where the collector of Q1 is tied to the output rather than to Vcc. As the output voltage decreases, the current channeled to Q2 from Q1 (and therefore the likelihood of Q2 saturating) also decreases. Generally, however, Q2 should still pull the output down to a bipolar $V_{SAT}$.

Figure 4:
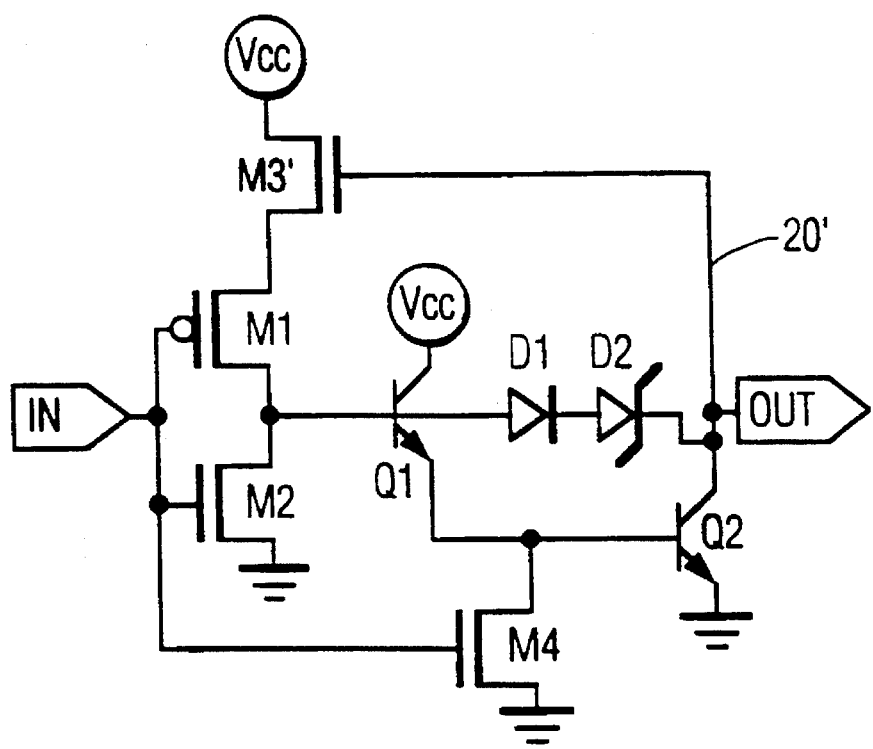

The second method of protecting the transistors from deep saturation is shown in FIG. 4. The PN junction diode D2 and Schottky diode D2 provide a means to drain the current from the base of Q1 once the output voltage has dropped below approximately 0.2 volt. This shuts off Q1 and protects Q2 from saturating. A further description of this operation can be found below in connection with the description of FIG. 6.

Figure 5:
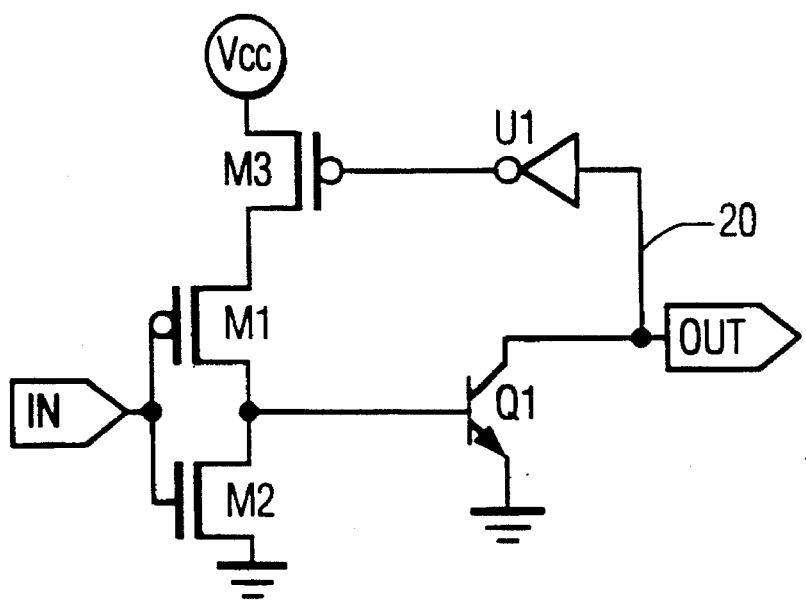

The circuit shown in FIG. 5 can also be considered e variant of the invention, but it lacks the advantages of the Darlington configuration. It does not provide as much gain, nor can it be guaranteed to pull the output all the way down before being shut off by the feedback 20 from the output.

FIG. 4 also shows one of several minor variations to the circuit; using in the feedback circuit 20' an N channel MOSFET M3' instead of the P-channel/inverter combination gives the same functional result, except that M3 would turn off sooner with no delay through the inverter stage inverter.

Other variations include:

(1) Using Schottky clamped transistors for Q1 and Q2. This would also prevent the transistors from operating in saturation which would increase the operating frequency, and (2) Stacking inverting stages to drive M3. This increases the shut-off delay for the circuit.

The foregoing circuits provided feedback from the output to a MOS switch connected to the CMOS input, which has channelled current from the DC voltage source, Vcc, to turn on a bipolar transistor to pull-down the output voltage all the way to within a $V_{SAT}$ voltage drop from ground, in order to turn-off the MOS switch to minimize power dissipation.

In the next series of embodiments, similar arrangements perform other functions.

Figure 6:
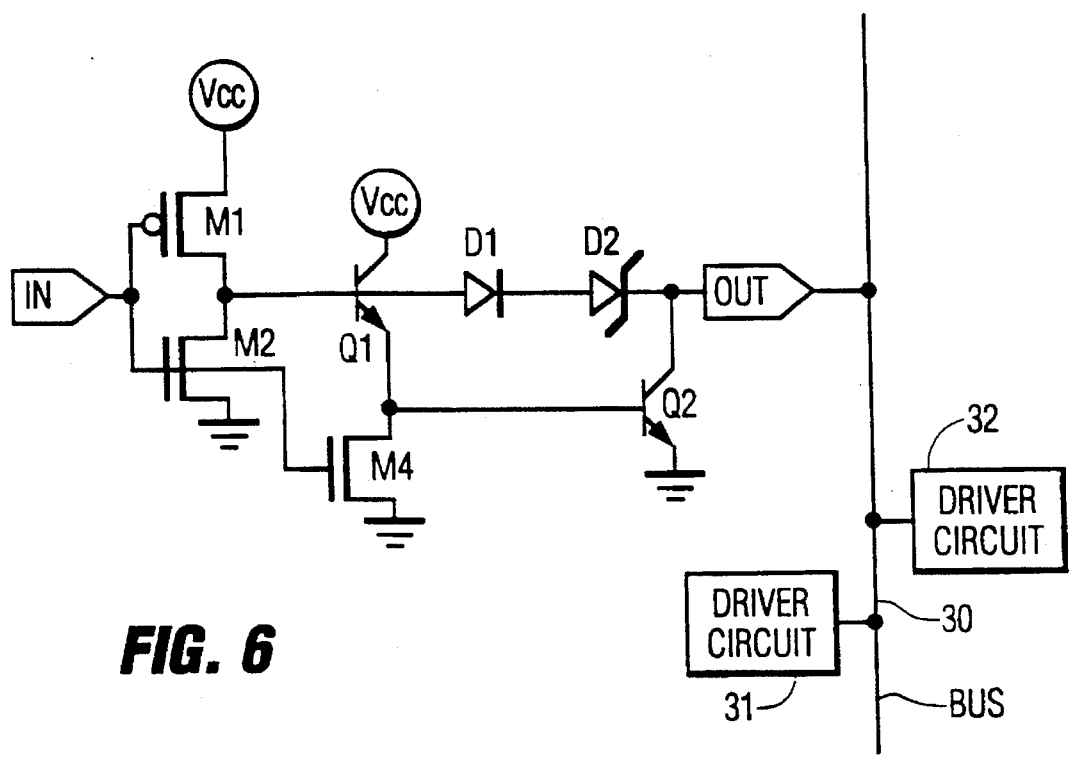
FIG. 6 shows a schematic of one form of a current-sink-on-demand output driver circuit in accordance with the invention connected with other driver circuits to a common bus.

FIG. 6 shows one form of circuit configuration for a current-sink-on-demand output driver circuit according to the invention. The circuit comprises a BiCMOS arrangement of CMOS input comprising a PMOS device M1 and an NMOS device M2, whose source-drain electrodes are connected in series between a DC voltage supply Vcc and ground. Input signals represented by IN are applied to the CMOS gates in parallel. The MOS output is connected to the base electrode of a NPN bipolar transistor, Q1, whose collector is connected to Vcc, and whose emitter is connected via NMOS M4 to ground, with the NMOS M4 gate also being driven by the input signal. Also connected to the Q1 emitter is the base of a second NPN bipolar transistor, Q2, whose emitter is grounded, and whose collector is connected to the output, OUT. Also connected between the output and the Q1 base are two serial-connected diodes. The first, D1, is a PN junction diode; the second, D2, is a Schottky diode. Both diodes are poled with their negative terminal connected to the output.

During normal operation of this circuit, the input IN will be driven low which allows the bases of Q1 and Q2 to be charged via Mi. As long as the output voltage OUT is greater than 0.2 volts ($V_{D1}+V_{D2}+V_{OUTPUT}>V_{BE1}+V_{BE2}$), the diodes are effectively off and the transistors Q1 and Q2 remain on. When the output voltage falls below 0.2 volts ($V_{BE1}+V_{BE2}>V_{D1}+V_{D2}+V_{OUTPUT}$), the diodes become forward biased and drain current from the base of transistor Q1, lowering its base voltage to approximately 1.2 volts ($V_{D1}+V_{D2}$), so that it no longer provides current to the base of Q2, and thereby effectively disables Q2's operation. The transistors will remain off until the output voltage is forced above 0.2 volts.

The circuit shown in FIG. 6 allows Incident Wave Switching by sinking large bus currents quickly to ground. The current sink may be sized to pull transmission line potentials down to 0.8 volts, the valid logic-low level, for various loads. The circuit acts as a Glitch Suppressor since any bus voltage greater than 0.2 volts will shut the diodes off, thereby re-activating the transistors Q1 and Q2, which will pull the bus voltage back down with much greater gain than traditional circuits. As long as the resistance through MOSFET M1 is high, the static current drain necessary to operate the current sink remains low. The circuit as shown is connected to a bus 30, to which other driver circuits 31, 32 may be connected.

The basic circuit shown in FIG. 6 has one disadvantage. When the input is driven low the circuit is active instantly, and quickly sinks large currents from the output. The result is ringing, or noise, about ground potential. This is undesirable, because it means that the bus voltage fluctuates until the ringing stops, which will increase the bus settling time.

Figure 7:
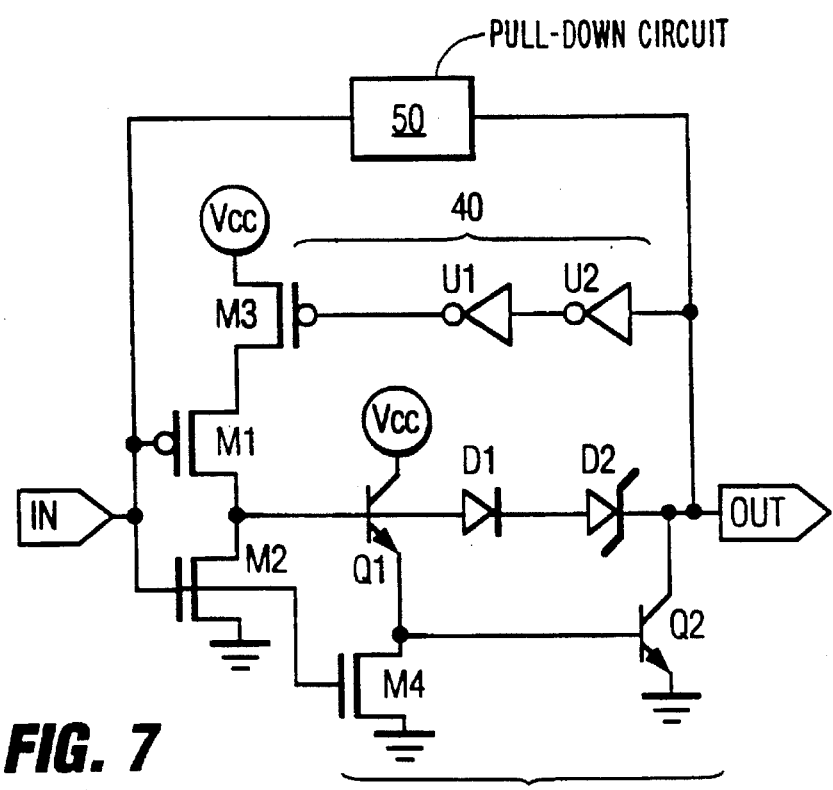
FIG. 7 shows another form of current-sink-on-demand output driver circuit in accordance with the invention.

FIG. 7 shows the same circuit but modified to reduce or eliminate the ringing in accordance with this aspect of the invention. In the improved circuit, a feedback circuit referenced 40 is added in parallel with the original current sink circuit designated 41. The feedback circuit 40 comprises two serial-connected inverters U1, U2 connected between the output and the gate of a PMOS transistor M3 whose source-drain is connected in series with the source-drains of M1 and M2.

A pull-down circuit 50 is used to initially draw the output voltage down. However, the circuit 50 generally has little or no current sinking ability at low voltages. The inverters, U1 and U2 keep the high-current sink circuit 41 off until the output voltage drops below the threshold $V_{TH}$ of U2. U2 changes to a logic high, U1 changes low, activating M3, which in turn activates the circuit 41. The hand-off between the pull-down circuit 50 and the current sink circuit 41 drains bus current quickly, but gently, thereby causing very little noise and substantially no ringing. The pull-down circuit 50 can be one of the circuits of FIGS. 2–5.

All of the foregoing circuits are implemented as ICs, and the addition of the added components and the feedback circuits add very little extra cost.

The current-sink-on-demand output driver of FIG. 7 may be modified in two ways:

(1) Using Schottky-clamped transistors Q1 and Q2. This helps keep the transistors Q1 and Q2 from saturating, which increases the operating frequency. The disadvantages of this method are the extra capacitance at the bases of the transistors, which slow the turn-on times.

(2) Using some other combination of diodes to adjust the circuit's shut-off threshold. Any number of any diodes may be used to modify the actual shut-off threshold. The diodes used may include Zener, Schottky, PN-Junction, and diode-connected MOS clamps. However, the optimum operating threshold is slightly lower than the voltage drop of the transistors Q1 and Q2.

Figure 8:
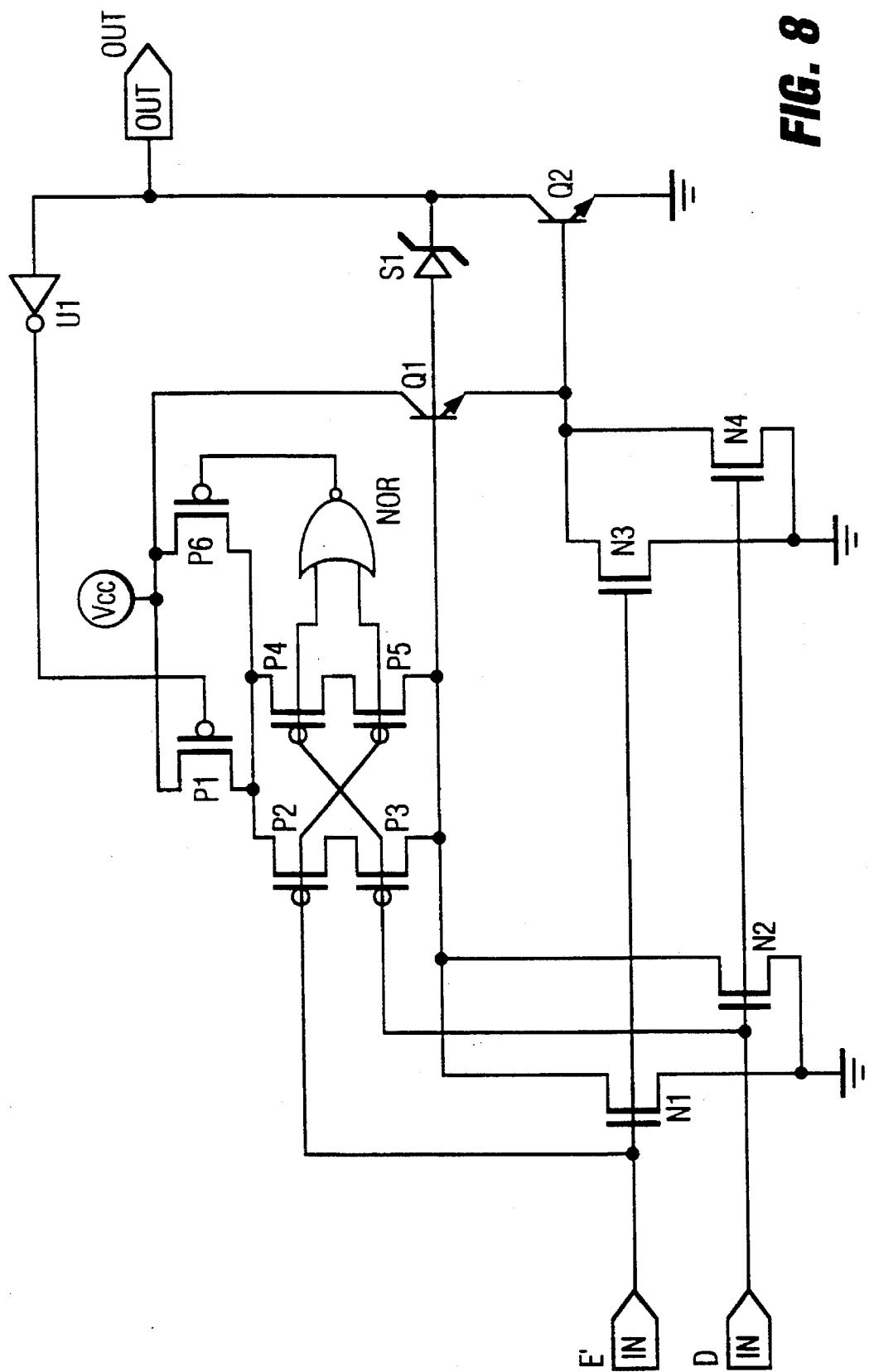
FIG. 8 shows another form of zero-static power output driver circuit in accordance with the invention.

FIG. 8 shows another form of zero-static-power pull-down driver in accordance with the invention actually reduced to practice. This circuit is similar to that shown in FIG. 3, with the same reference letters and numerals used in FIG. 8 for circuit elements performing the same functions as in FIG. 3. In this particular case, the circuit was part of a low voltage transceiver with input D and featuring 3-state bus outputs enabled by the E' input. P1 in FIG. 8 corresponds to M3 in FIG. 3; N1 and N2 in FIG. 8 correspond to M2 in FIG. 3. The NOR gate operates P6 as a one-shot. With E' low and D high, the NOR turns P6 on. When D goes low and turns on P3 and P 4, P6 gives an additional short spike of current before the NOR turns it off.

N3 and N4 in FIG. 8 correspond to M4 in FIG. 3.

Schottky diode S1 corresponds to D1 and D2 in FIG. 4, but having the lower voltage drop.

The circuit otherwise operates the same as in FIG. 3.

It is noted that in this circuit schematic as in all the others, crossing lines do not form connections at their crossing, except where a line passes through the gate of a MOSFET or the base of a bipolar.

Figure 9:
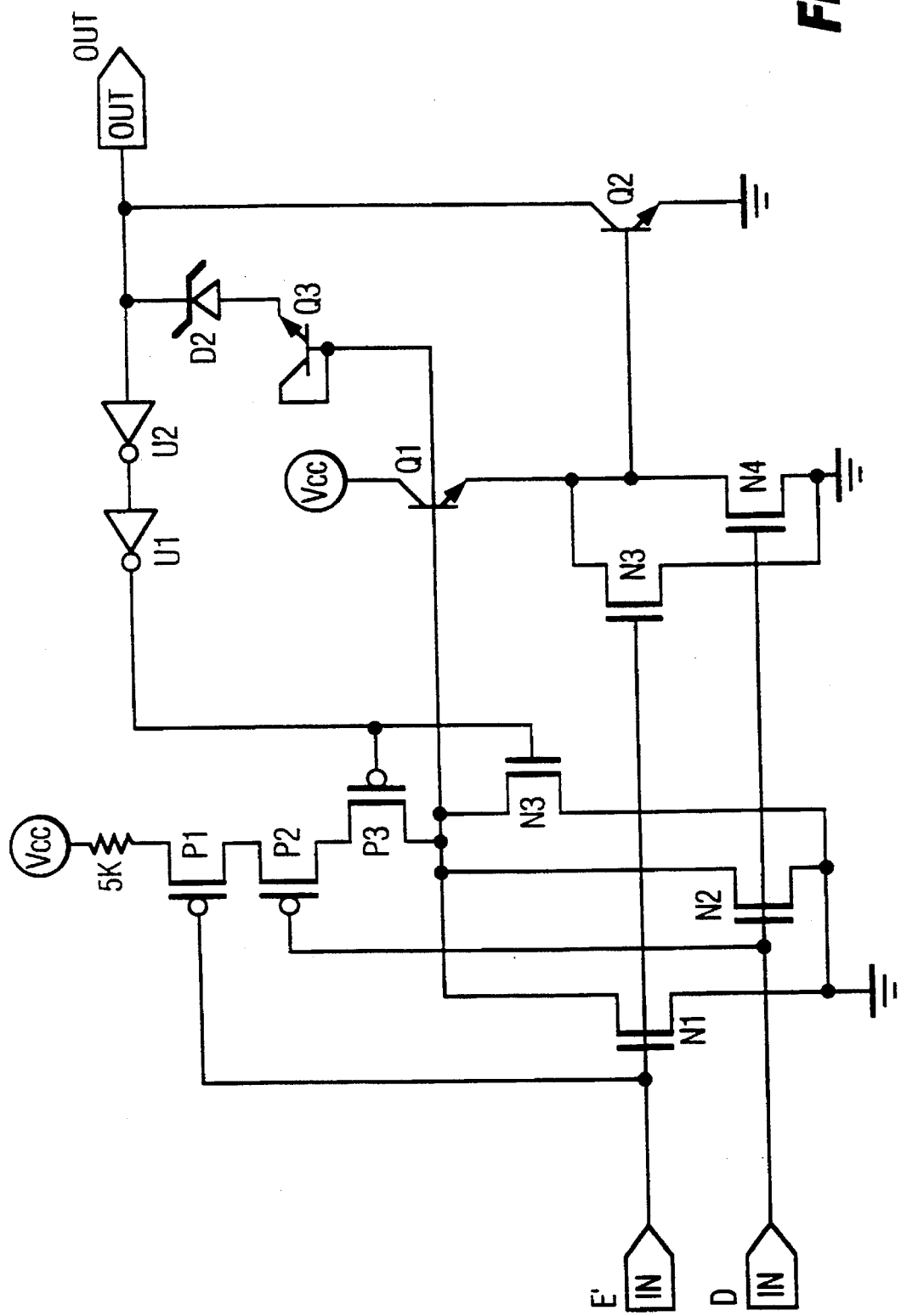
FIG. 9 shows another form of current-sink-on-demand output driver circuit in accordance with the invention.

FIG. 9 shows a circuit in accordance with the invention actually reduced to practice in the same transceiver part mentioned in connection with FIG. 8, and similar in function to the current-sink-on-demand circuit shown in FIG. 7. Similar functioning components have the same reference numerals. N1, N2, and N3 in FIG. 9 correspond to M2 in FIG. 7; P1 and P2 in FIG. 9 correspond to M1 in FIG. 7; P3 in FIG. 9 corresponds to M3 in FIG. 7; N3 and N4 correspond to M4 in FIG. 7; Q3 in FIG. 9 with its interconnected base and collector corresponds to D1 in FIG. 7. The 5K resistor reduces the operating voltage for the serial connected MOS devices shown.

Figure 10:
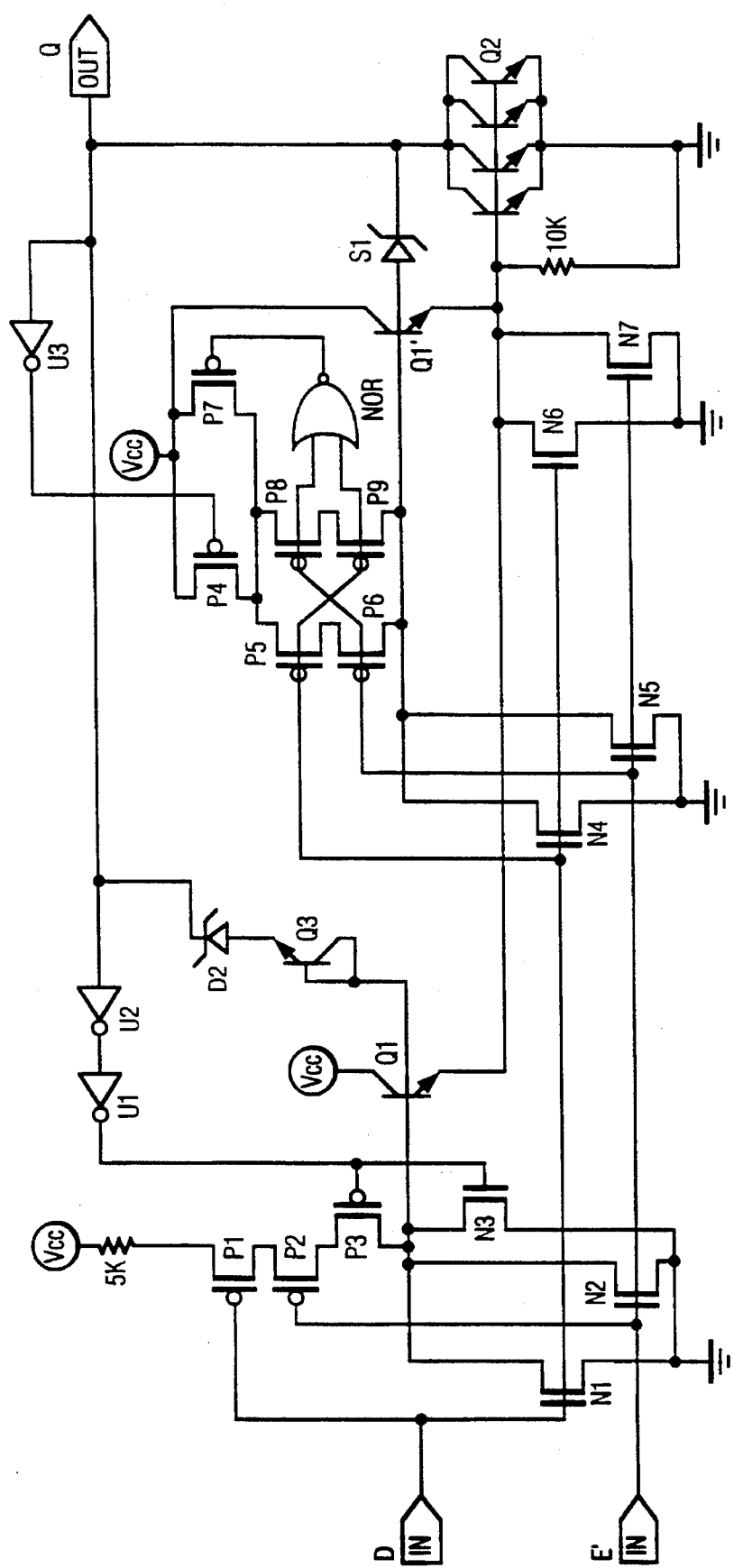
FIG. 10 shows a circuit of the invention combining the features of the zero-static-power and current-sink-on-demand circuits.

FIG. 10 shows another circuit in accordance with the invention that combines in one circuit the zero-static-power feature with the current-sink-on-demand feature of the invention. The left-hand part of the circuit corresponds to that in FIG. 8, and the right-hand part corresponds to that in FIG. 9. Q1 and Q1' correspond to Q1 in FIGS. 8 and 9, respectively, Those skilled in the art will readily be capable of understanding the operation of the FIG. 10 circuit, and further explanation is unnecessary, except to point out that combining the features means that the zero-static-power part starts immediately and pulls-down the voltage at OUT rapidly, and then turns-off to conserve power, whereupon the current-sink-on-demand part takes over and allows the voltage to transit high-to-low gently to avoid ringing, and maintains the voltage in its low state despite fluctuations in the bus voltage. The result is good Incident Wave Switching with low noise and Glitch Suppression at the expense of a little power associated with the current-on-demand circuit operation. It will therefore be apparent that the zero-static-power and the current-sink-on-demand circuit functions of the invention can be used separately or together.

While the invention has been described in connection with preferred embodiments, it will be understood that modifications thereof within the principles outlined above will be evident to those skilled in the art and thus the invention is not limited to the preferred embodiments but is intended to encompass such modifications.

What is claimed is:

1. An electronic circuit comprising a BiCMOS bus line driver circuit for driving a bus line in a substantially zero-static-power mode connected between first and second supply terminals, the driver having:

an input node and an output node;

a CMOS input device having a data input connected to the input node and having a data output, wherein an NMOS transistor of said CMOS input device has a gate coupled to said input node;

a first bipolar transistor having a control input coupled to the data output of the CMOS input device and having a current channel connected between the output node and the second supply terminal for discharging the output node under control of the CMOS input device; and control circuitry coupled between the output node and the control input of the first bipolar transistor for increasing a discharging capability of the first bipolar transistor in response to a glitch at the output node and for preventing the first bipolar transistor from reaching saturation.

2. The circuit of claim 1, wherein the control circuitry comprises at least one of:

a second bipolar transistor forming a Darlington configuration with the first bipolar transistor and having a collector-emitter path connected between a collector and a base of the first bipolar transistor; and a transistor having a current channel connected in series with current channels of transistors of the CMOS input device and having a control node coupled to the output node.

3. The circuit of claim 1, wherein the control circuitry comprises at least one of:

a second bipolar transistor forming a Darlington configuration with the first bipolar transistor and having a collector-emitter path connected between the first supply terminal and a base of the first bipolar transistor, a diode having an anode connected to the data output of the CMOS input device and to a base of the second bipolar transistor and a cathode coupled to the output node; and a transistor having a current channel connected in series with current channels of transistors of the CMOS input device and having a control node.

* * * * *